US012274081B2

(12) United States Patent
Chang et al.

(10) Patent No.: US 12,274,081 B2
(45) Date of Patent: Apr. 8, 2025

(54) SEMICONDUCTOR STRUCTURE AND METHOD FOR FORMING THE SAME

(71) Applicant: UNITED MICROELECTRONICS CORP., Hsin-Chu (TW)

(72) Inventors: Ming-Hua Chang, Tainan (TW); Po-Wen Su, Kaohsiung (TW); Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/519,099

(22) Filed: Nov. 27, 2023

(65) Prior Publication Data

US 2024/0088279 A1 Mar. 14, 2024

Related U.S. Application Data

(62) Division of application No. 17/396,793, filed on Aug. 9, 2021, now Pat. No. 12,218,229.

(30) Foreign Application Priority Data

May 14, 2021 (CN) .......................... 202110527145.7

(51) Int. Cl.
*H10D 30/47* (2025.01)
*H01L 21/311* (2006.01)
(Continued)

(52) U.S. Cl.
CPC ...... *H10D 30/472* (2025.01); *H01L 21/31116* (2013.01); *H10D 30/015* (2025.01); *H10D 62/8503* (2025.01)

(58) Field of Classification Search
CPC ............ H01L 29/7787; H01L 29/0619; H01L 29/2003; H01L 29/404; H01L 21/8252; H01L 27/0605; H01L 27/085; H01L 29/0684; H01L 29/1066; H01L 29/402; H01L 29/42316; H01L 29/66462; H01L 29/7786; H01L 29/475; H01L 23/28; H01L 23/3171; H01L 23/3192;
(Continued)

(56) References Cited

U.S. PATENT DOCUMENTS 8,895,992 B2 11/2014 Liu
10,062,943 B2 8/2018 Li
(Continued)

FOREIGN PATENT DOCUMENTS

EP 3 796 395 A1 3/2021
KR 10-2022-0153962 A 11/2022

*Primary Examiner* — Natalia A Gondarenko
(74) *Attorney, Agent, or Firm* — Winston Hsu (57) ABSTRACT

A method for forming a semiconductor structure includes the steps of forming a stacked structure on a substrate, forming an insulating layer on the stacked structure, forming a passivation layer on the insulating layer, performing an etching process to form an opening through the passivation layer and the insulating layer to expose a portion of the stacked structure and an extending portion of the insulating layer, and forming a contact structure filling the opening and directly contacting the stacked structure, wherein the extending portion of the insulating layer is adjacent to a surface of the stacked structure directly contacting the contact structure.

10 Claims, 11 Drawing Sheets

(51) Int. Cl.
*H10D 30/01* (2025.01)
*H10D 62/85* (2025.01)

(58) Field of Classification Search
CPC ... H01L 29/122–127; H01L 29/15–158; H01L 29/6656; H01L 29/66431; H01L 29/6653; H01L 29/66719; H01L 29/778–7789; H01L 29/7816; H01L 29/808; H01L 2924/13064; H01L 21/02183; H01L 21/02164; H01L 21/0228; H01L 21/02274; H01L 21/02107; H01L 21/02112; H01L 21/022; H01L 21/02208; H01L 21/02205; H01L 21/02225; H01L 21/0229; H01L 21/2123; H01L 21/0217; H01L 21/28114; H01L 21/823468; H01L 21/823864; H01L 21/823456; H01L 21/82385; H01L 29/41725; H01L 29/7783; H01L 29/0603; H01L 29/66477; H01L 21/30621; H01L 21/31122; H01L 21/31116; H01L 29/7781; H10D 30/015; H10D 30/021; H10D 30/471; H10D 30/472; H10D 30/473; H10D 30/475; H10D 30/4732; H10D 30/4755; H10D 30/476; H10D 62/052; H10D 62/292; H10D 62/824; H10D 62/8503; H10D 62/10; H10D 62/124; H10D 62/343; H10D 64/111; H10D 64/112; H10D 64/118; H10D 64/251; H10D 64/254; H10D 64/258; H10D 64/27; H10D 64/20; H10D 64/23; H10D 64/311; H10D 64/411; H10D 64/512–518; H10D 64/602; H10D 64/605; H10D 64/62; H10D 64/64; H10D 64/649; H10D 84/0126; H10D 84/013; H10D 84/0133; H10D 84/0135; H10D 84/014; H10D 84/0142; H10D 84/0144

USPC ..... 257/76, 77, 190, 194, 192, 183; 438/172
See application file for complete search history.

(56) References Cited

U.S. PATENT DOCUMENTS

| | | |
|---|---|---|
| 10,109,474 B1 | 10/2018 | Wang |
| 10,153,342 B1 | 12/2018 | He |
| 10,262,986 B2 | 4/2019 | Dai |
| 10,460,980 B2 | 10/2019 | Verma |
| 11,600,708 B2 | 3/2023 | Liao |
| 2011/0210377 A1 | 9/2011 | Haeberlen |
| 2014/0092637 A1 | 4/2014 | Minoura |
| 2014/0209922 A1 | 7/2014 | Ota |
| 2016/0099345 A1 | 4/2016 | Ramer |
| 2018/0308968 A1* | 10/2018 | Miura ............... H01L 21/02381 |
| 2019/0378708 A1 | 12/2019 | Watanabe |
| 2020/0350399 A1 | 11/2020 | Wong |
| 2022/0254912 A1* | 8/2022 | Ramdani ............ H01L 29/7786 |
| 2022/0367698 A1 | 11/2022 | Hwang |

\* cited by examiner

SEMICONDUCTOR STRUCTURE AND METHOD FOR FORMING THE SAME

CROSS REFERENCE TO RELATED APPLICATIONS

This application is a division of U.S. application Ser. No. 17/396,793, filed on Aug. 9, 2021. The content of the application is incorporated herein by reference.

BACKGROUND OF THE INVENTION

1. Field of the Invention

The present invention relates to a semiconductor structure and a method for forming the same. More particularly, the present invention relates to a high electron mobility transistor (HEMT) and a method for forming the same.

2. Description of the Prior Art

A high electron mobility transistor (HEMT) is a new type of field effect transistor and usually includes a hetero stacked structure including stacked semiconductor layers. By bonding semiconductor layers with different band gaps, the energy band near the heterojunction between the semiconductor layers may bend and form a potential well. The free electrons in the semiconductor layers may converge into the potential well thereby forming a two-dimensional electron gas (2DEG) layer near the heterojunction. The two-dimensional electron gas layer may be utilized as a channel region of the high electron mobility transistor to conduct current. In current semiconductor technology, group III-V semiconductor materials have been widely used for manufacturing high electron mobility transistors. Among them, gallium nitride (GaN) based materials have drawn a lot of attention for having wide band gaps, high breakdown voltages, high bonding strengths, and high thermal stabilities. The unique spontaneous polarization and piezoelectric polarization properties of the gallium nitride (GaN) based compounds materials may advance the formation of a two-dimensional electron gas layer with high electron concentration and high electron mobility, so that a higher switching speed and response frequency may be obtained. Due to these beneficial properties, GaN based materials have gradually replaced the silicon based materials for forming semiconductor devices used in technical fields such as power converters, low noise amplifiers, radio frequency (RF) or millimeter wave (MMW).

Currently, the manufacturing of high electron mobility transistors still has problems need to be solved. For example, during the etching process for forming contact openings through the passivation layer and insulating layer on the hetero stacked structure of the high electron mobility transistor, an insufficient etching may cause the contact openings not penetrating through the insulating layer or leave residues of the insulating layer on the semiconductor exposed from the bottom of the contact openings, while an over etching may cause excessive loss and damages to the semiconductor layer. Both of the above situations may result in a defective contact between the contact structure and the semiconductor layer and cause yield loss.

SUMMARY OF THE INVENTION

In light of the above, the present invention is directed to provide a semiconductor structure with an improved contact quality and increased production yield, and a method for forming the same.

According to one embodiment of the present invention, a semiconductor structure includes a substrate, a stacked structure on the substrate, an insulating layer on the stacked structure, a passivation layer on the insulating layer, and a contact structure through the passivation layer and the insulating layer and directly contacting the stacked structure, wherein the insulating layer comprises an extending portion protruding from a sidewall of the passivation layer and adjacent to a surface of the stacked structure directly contacting the contact structure.

According to another embodiment of the present invention, a method for forming a semiconductor structure includes the steps of forming a stacked structure on a substrate, forming an insulating layer on the stacked structure, forming a passivation layer on the insulating layer, performing an etching process to form an opening through the passivation layer and the insulating layer to expose a portion of the stacked structure and an extending portion of the insulating layer, and forming a contact structure filling the opening and directly contacting the stacked structure, wherein the extending portion of the insulating layer is adjacent to a surface of the stacked structure directly contacting the contact structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

Figure 1:
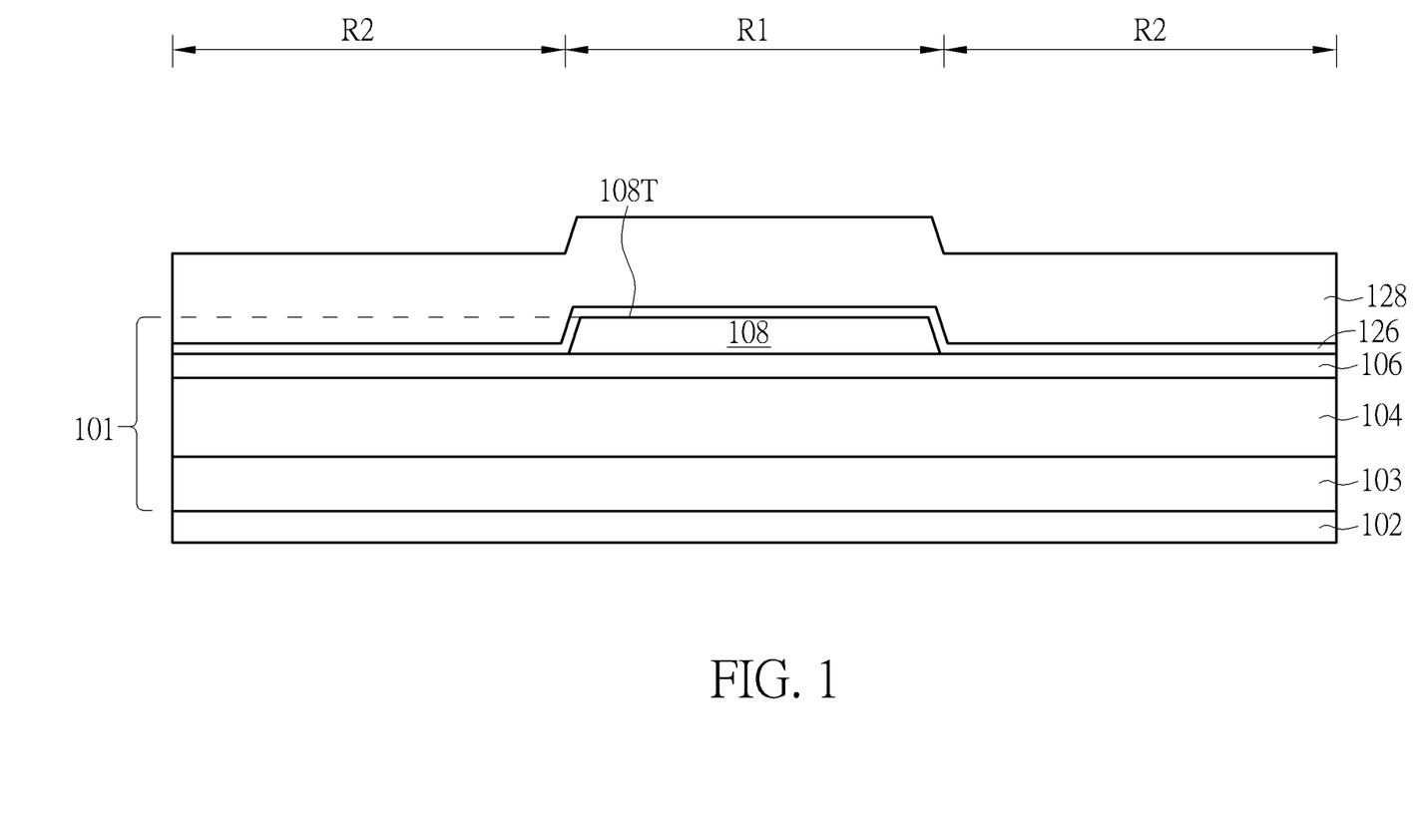
FIG. 1, FIG. 2 and FIG. 3 are schematic cross-sectional views illustrating the steps for forming a semiconductor structure according to a first embodiment of the present invention.
Figure 2:
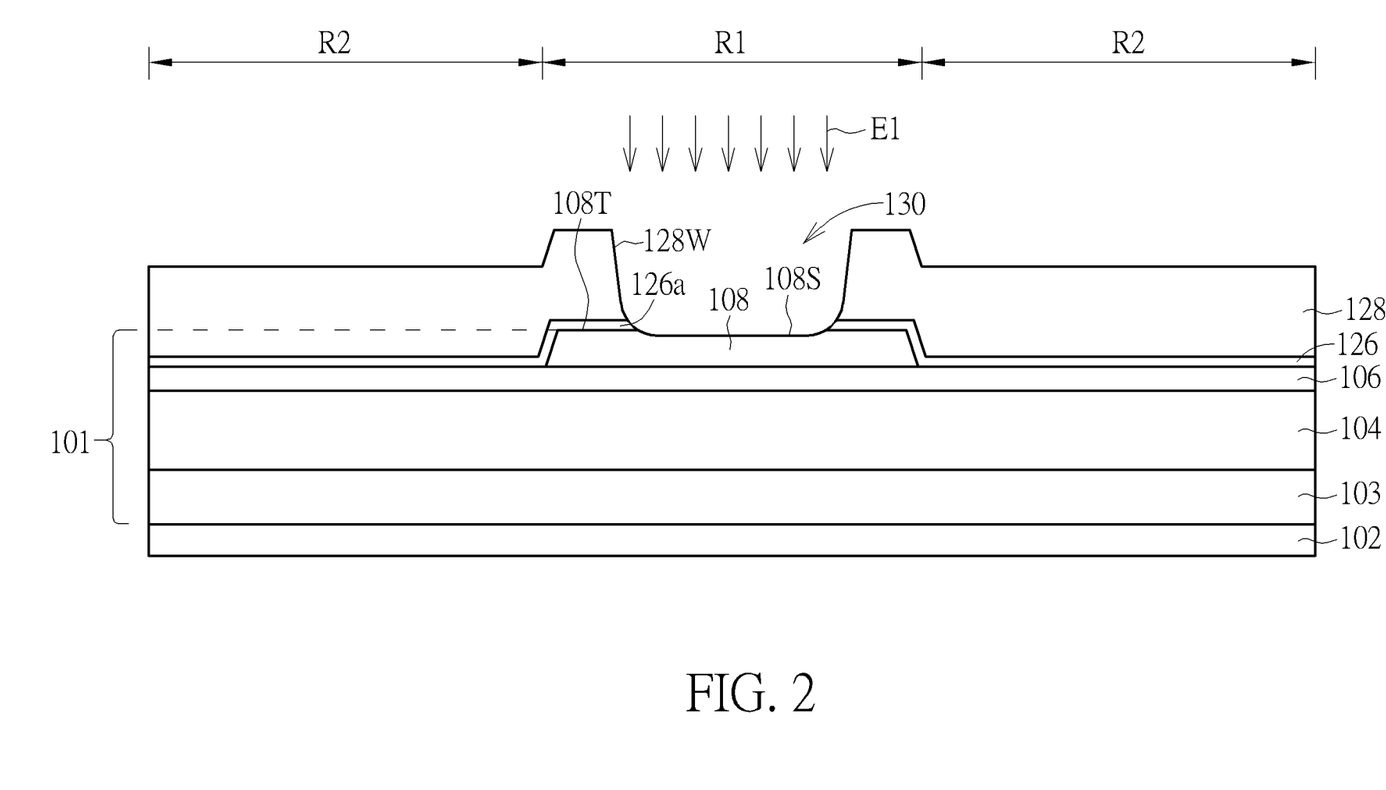
Figure 3:
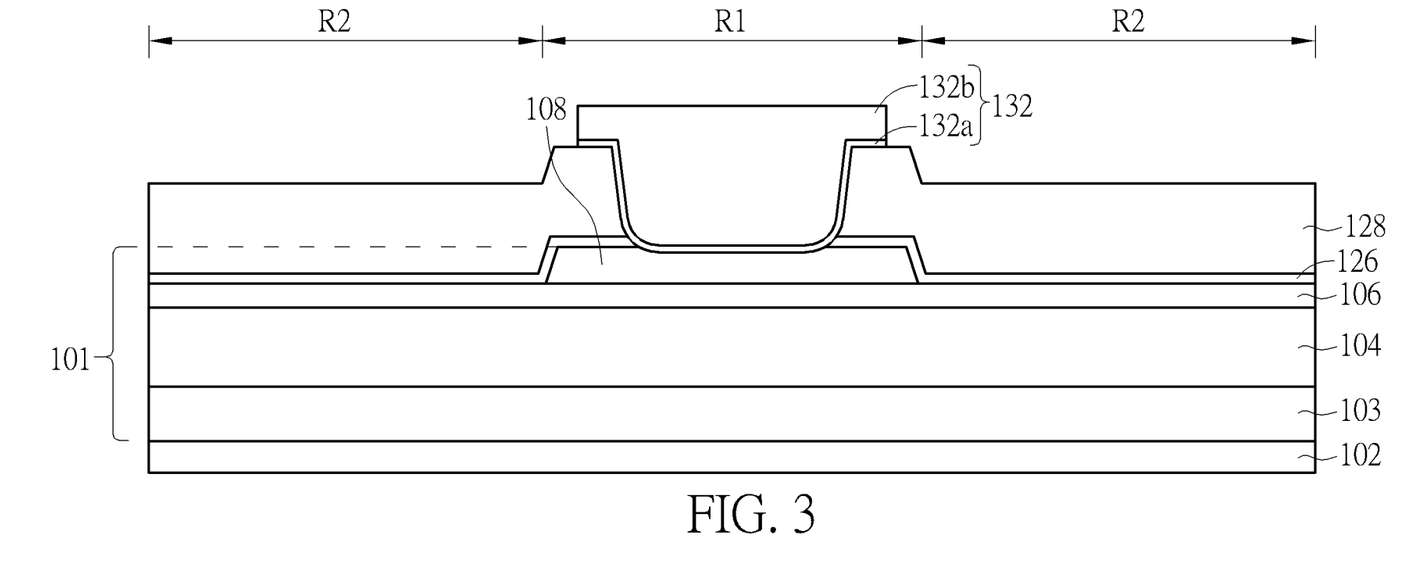

FIG. 1, FIG. 2 and FIG. 3 are schematic cross-sectional views illustrating the steps for forming a semiconductor structure according to a first embodiment of the present invention. Please refer to FIG. 1, a substrate 102 is provided. The material of the substrate 102 may include silicon, silicon carbide (SiC), sapphire, gallium nitride (GaN), aluminum nitride (AlN), or other suitable materials, but is not limited thereto. Subsequently, a stacked structure 101 is formed on the substrate 102. The stacked structure 101 has a multi-layered structure, and may include, form the bottom (near the substrate 102) to the top (away from the substrate 102), a buffer layer 103, a channel layer 104, and a barrier layer 106. According to some embodiments of the present invention, the semiconductor structure may be an enhancement mode high electron mobility transistor (HEMT), and the stacked structure 101 may further include a gate layer 108 on the barrier layer 106. As shown in FIG. 1, the stacked structure 101 may include a gate region R1 and source/drain (S/D) regions R2 at two sides of the gate region R1.

According to an embodiment of the present invention, the buffer layer 103, the channel layer 104, the barrier layer 106, and the gate layer 108 may be successively form on the substrate 102 by performing a heteroepitaxy growth process. A patterning process such as a photolithography-etching process may be performed to pattern the gate layer 108 and remove unnecessary portions of the gate layer 108 outside the gate region R1 to obtain the gate layer 108 (patterned) as shown in FIG. 1. According to an embodiment of the present invention, the heteroepitaxy growth process may include molecule beam epitaxy (MBE) process, a metal-organic chemical vapor deposition (MOCVD) process, or a hydride vapor phase deposition (HVPE) process, but is not limited thereto.

The buffer layer 103, the channel layer 104, the barrier layer 106, and the gate layer 108 may respectively include III-V semiconductor materials, such as gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but are not limited thereto. According to an embodiment of the present invention, the buffer layer 103 may include aluminum gallium nitride (AlGaN), the channel layer 104 may include gallium nitride (GaN), the barrier layer 106 may include aluminum gallium nitride (AlGaN), and the gate layer 108 may include p-type gallium nitride (p-GaN) having dopants such as magnesium (Mg), iron (Fe) or other suitable p-type dopants. According to an embodiment of the present invention, the thickness of the gate layer 108 may be 3 to 12 times of the thickness of the barrier layer 106. For example, the gate layer 108 may have a thickness between 60 nm and 100 nm, and the barrier layer 106 may have a thickness between 8 nm and 20 nm, but are not limited thereto.

Please continue to refer to FIG. 1. After the gate layer 108 being patterned, an insulating layer 126 is formed on the stacked structure 101 and conformally covers the sidewalls and top surface 108T of the gate layer 108. Subsequently, a passivation layer 128 is formed on the insulating layer 126. The insulating layer 126 and the passivation layer 128 may respectively include a dielectric material, such as aluminum nitride (AlN), aluminum oxide ($Al_2O_3$), boron nitride (BN), silicon nitride (SiN), silicon oxide ($SiO_x$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, or other suitable dielectric materials, but is not limited thereto. The materials and thicknesses of the insulating layer 126 and the passivation layer 128 may influence the leakage current, breakdown voltage, and output power of the high electron mobility transistor. According to an embodiment of the present invention, the insulating layer 126 may preferably include aluminum oxide ($Al_2O_3$) with a thickness of approximately between 2.5 nm and 10 nm, but is not limited thereto. The passivation layer 128 may preferably include silicon oxide (SiOx) or silicon nitride (SiN) with a thickness of approximately between 150 nm and 2500 nm, but is not limited thereto.

Please refer to FIG. 2. Subsequently, a patterned mask (not shown) may be formed on the passivation layer 128, and an etching process E1 may be performed, using the patterned mask as an etching mask to etch the passivation layer 128 and the insulating layer 126 to form an opening 130 through the passivation layer 128 and the insulating layer 126 and exposing a surface 108S of the gate layer 108. During the etching process E1, the portion of the gate layer 108 exposed from opening 130 may be over-etched to ensure that no residues of the insulating layer 126 are remained on the surface 108S. That is, the surface 108S is an etched surface of the gate layer 108. According to some embodiments of the present invention, the etching process E1 may be a dry etching process, such as a reactive-ion etching (RIE) process or an inductively coupled plasma (ICP) etching process, but is not limited thereto.

It is noteworthy that the etching process E1 is critical for the contact quality between the gate layer 108 and the contact structure (the contact structure 132 as shown in FIG. 3) and the leakage current. An under-etching of the etching process E1 may cause the opening 130 not penetrating through the insulating layer 126 or residues of the insulating layer 126 remaining on the surface 108S of the gate layer 108, while an over-etching of the etching process E1 may cause damages to the gate layer 108 and worsen the leakage current. One feature of the present invention is that, by particularly using etching gases including fluorine (F) and not includes chlorine (Cl) during the etching process E1, the etching result may be well controlled to reduce the problems caused by under-etching or over-etching of the etching process E1 as illustrated above, so that a better contact quality and better electrical properties of the high electron mobility transistor may be obtained. According to an embodiment of the present invention, the etching process E1 may use an etching gas including at least one of SF6, CF4, CHF3, C3F6, C2F6, and NF3, but is not limited thereto. According to an embodiment of the present invention, the temperature of the etching process E1 is preferably controlled between −15° C. and 35° C., and the pressure of the etching process E1 is preferably controlled between 30 mtorr and 1300 mtorr.

As shown in FIG. 2, the portion of the gate layer 108 exposed from the opening 130 may be slightly recessed so that the surface 108S of the gate layer 108 exposed from the opening 130 may be lower than the top surface 108T of the gate layer 108 covered by the insulating layer 126. By selecting the etching gas of the process E1 as illustrated previously, the recessed depth of the surface 108S may be well controlled within a range not larger than 5 nm. According to an embodiment of the present invention, the recessed depth of the surface 108S may be controlled between 1 nm and 2 nm. It is noteworthy that after the etching process E1, the portion of the insulating layer 126 adjacent to the bottom edge of the opening 130 may have an extending portion 126a exposed from the opening 130, protruding from a sidewall 128W of the passivation layer 128 and extending along the top surface 108T of the gate layer 108.

Please refer to FIG. 3. Subsequently, a conductive layer (not shown) may be formed on the passivation layer 128, fills into the opening 130 and directly contacts the gate layer 108 on the surface 108S of the gate layer 108. A patterning process may be performed to pattern and remove unnecessary portions of the conductive layer to form the contact structure 132. The contact structure 132 may be the gate contact to electrically connect to the gate layer 108 of the semiconductor structure. According to some embodiments of the present invention, the contact structure 132 may include a liner 132a and a metal layer 132b on the liner 132a. The materials of the liner 132a and the metal layer 132b may respectively include metals, such as aluminum (Al), silver (Ag), gold (Au), copper (Cu), nickel (Ni), titanium (Ti), tantalum (Ta), tungsten (W), cobalt (Co), molybdenum (Mo), palladium (Pd), platinum (Pt), a compound of the above materials, a composite layer of the above materials, or an alloy of the above materials, but are not limited thereto. According to some embodiments of the present invention, the liner 132a may include titanium nitride (TiN), and the metal layer 132b may include aluminum (Al). The liner 132a is in direct contact with the gate layer 108, the insulating layer 126, and the passivation layer 128. The liner 132a may improve the bonding between the metal layer 132b and the gate layer 108, the insulating layer 126, and the passivation layer 128. The liner 132a may also suppress extrusion or diffusion of the metal layer 132b that may result in reliability degradation of the device. According to the embodiment, a Schottky contact may be formed between the contact structure 132 and the gate layer 108.

Please continue to refer to FIG. 3. The semiconductor structure provided by the first embodiment of the present invention includes a substrate 102, a stacked structure 101 disposed on the substrate 102, an insulating layer 126 on the stacked structure 101, and a passivation layer 128 on the insulating layer 126. The stacked structure 101 includes, form the bottom (near the substrate 102) to the top (away from the substrate 102), a buffer layer 103, a channel layer 104, a barrier layer 106, and a gate layer 108. A contact structure 132 penetrates through the passivation layer 128 and the insulating layer 126 and directly contacts the gate layer 108 of the stacked structure 101.

Figure 3A:
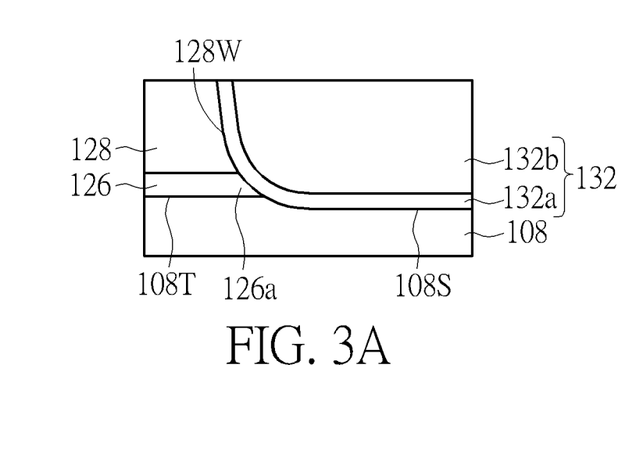
FIG. 3A is an enlarged view of a portion of the semiconductor structure shown in FIG. 3.

Please refer to FIG. 3A, which shows an enlarged view of a portion of the semiconductor structure shown in FIG. 3. The contact structure 132 is in direct contact with a surface 108S of the gate layer 108 that is lower than a top surface 108T of the gate layer 108 covered by the insulating layer 126. The insulating layer 126 adjacent to the bottom edge of the contact structure 132 includes an extending portion 126a protruding from a sidewall 128W of the passivation layer 128 and extending along the top surface 108T of the gate layer 108 to be adjacent to the surface 108S of the gate layer 108 and adjoin an edge of the surface 108S (the boundary between the top surface 108T and the surface 108S of the gate layer 108). The surface 108S of the gate layer 108 may have a concave profile starting from the tip point of the extending portion 126a and extending down to be lower than the top surface 108T and the extending portion 126a. According to an embodiment of the present invention, the surface of the extending portion 126a directly contacting the contact structure 132 and the surface 108S of the gate layer 108 may collectively form a continuous curved profile.

Figure 3B:
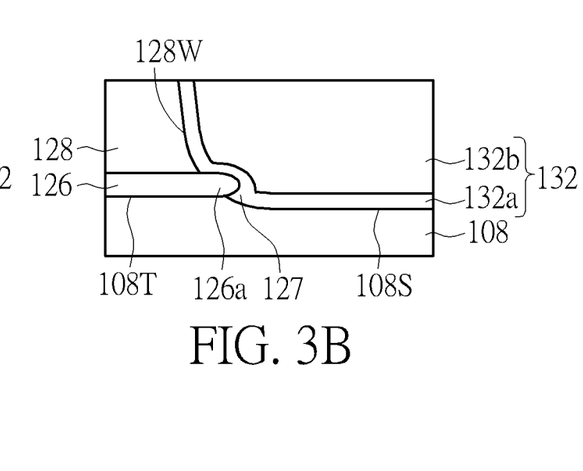
FIG. 3B is an enlarged view of a portion of a variant of the semiconductor structure shown in FIG. 3.

Please refer to FIG. 3B, which shows an enlarged view of a portion of a variant of the semiconductor structure shown in FIG. 3. By adjusting the etching selectivity to the insulating layer 126 during the etching process E1, the extending portion 126a may protrude further from the sidewall 128W of the passivation layer 128 and extends beyond the boundary between the top surface 108T and the surface 108S of the gate layer 108 and defines a space 127 between the extending portion 126a and the surface 108S of the gate layer 108. The liner 132a may completely fill the space 127 or partially fill the space 127 to form an air gap (not shown) in the space 127 and adjacent to the bottom edge of the contact structure 132. The extending portion 126a shown in FIG. 3A or FIG. 3B may provide adjustment to the electric field in nearby regions to increase threshold voltage and reduce gate leakage current, and the performance of the device for high frequency applications may be enhanced.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
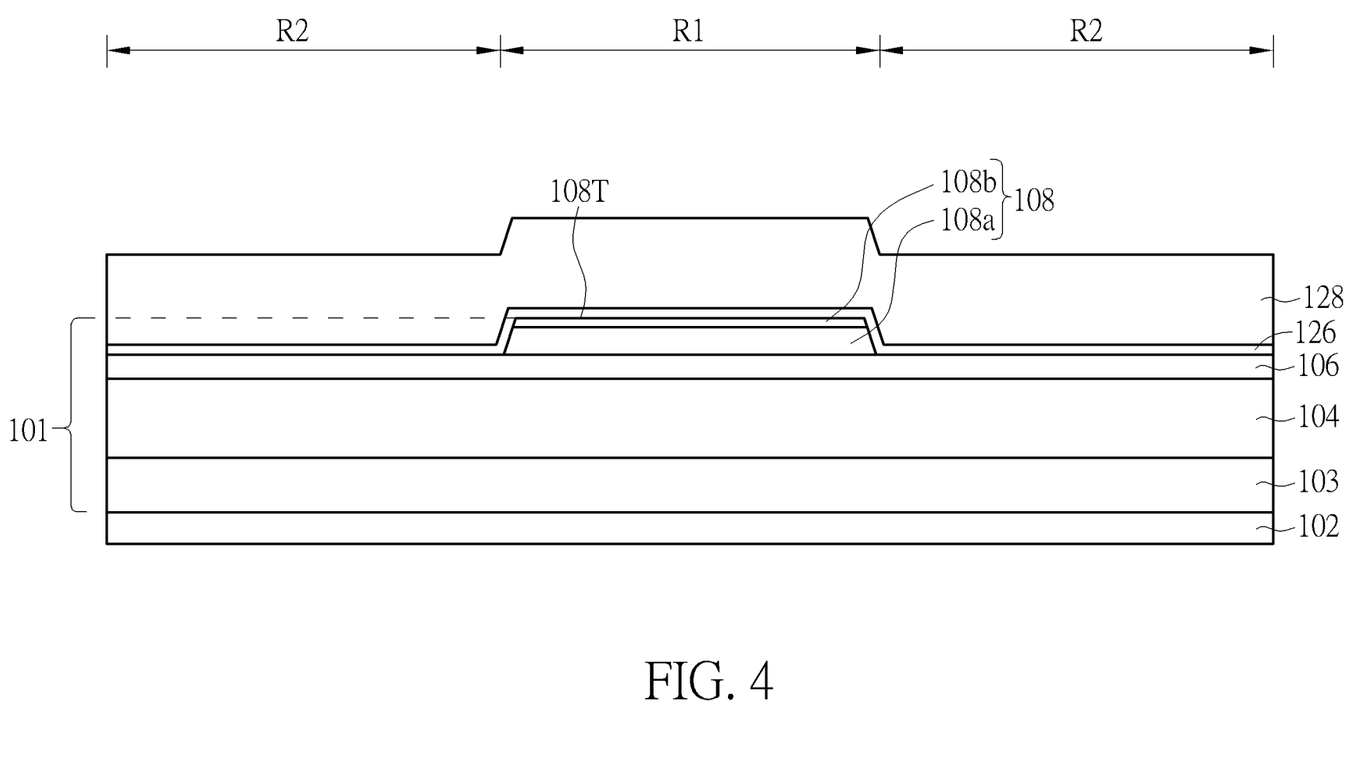
FIG. 4, FIG. 5 and FIG. 6 are schematic cross-sectional views illustrating the steps for forming a semiconductor structure according to a second embodiment of the present invention.
Figure 5:
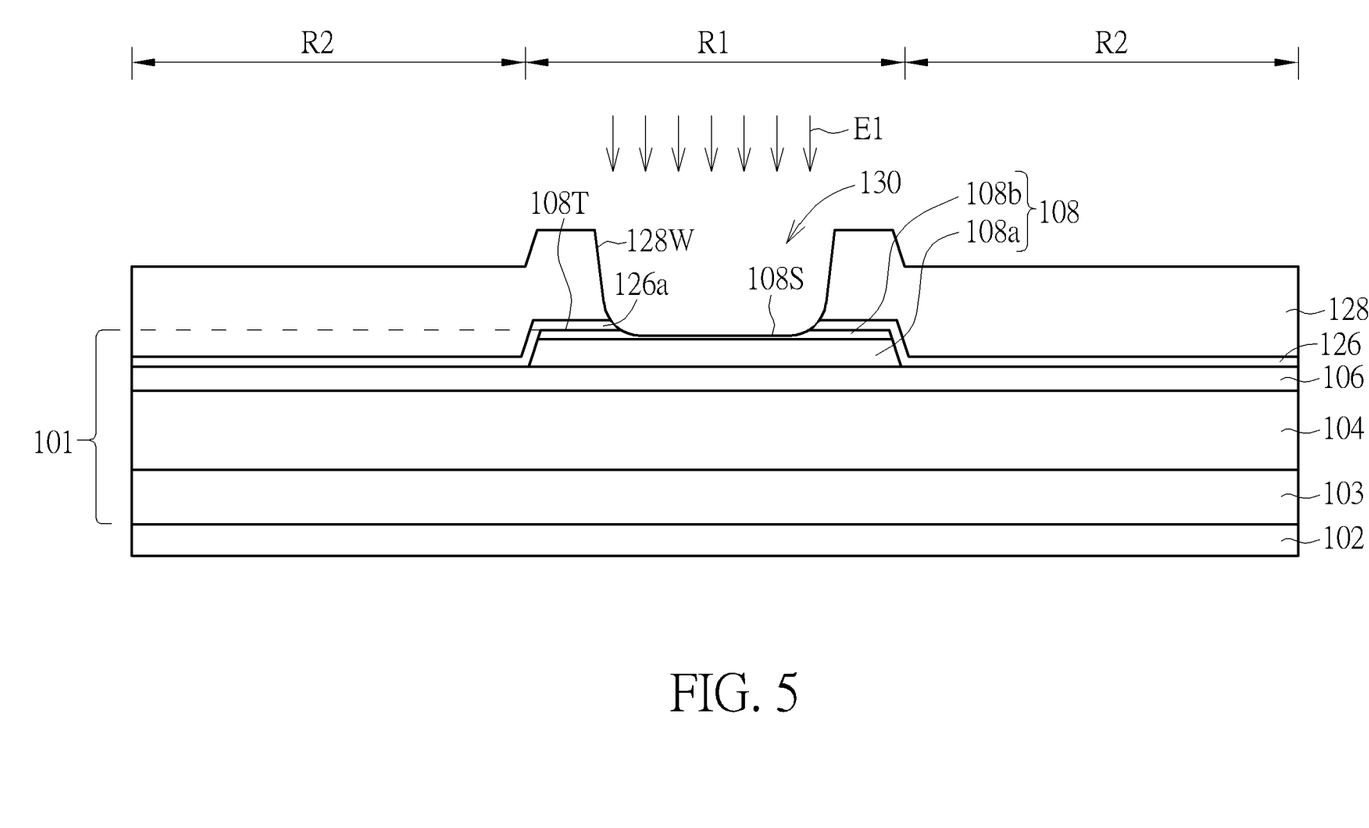
Figure 6:
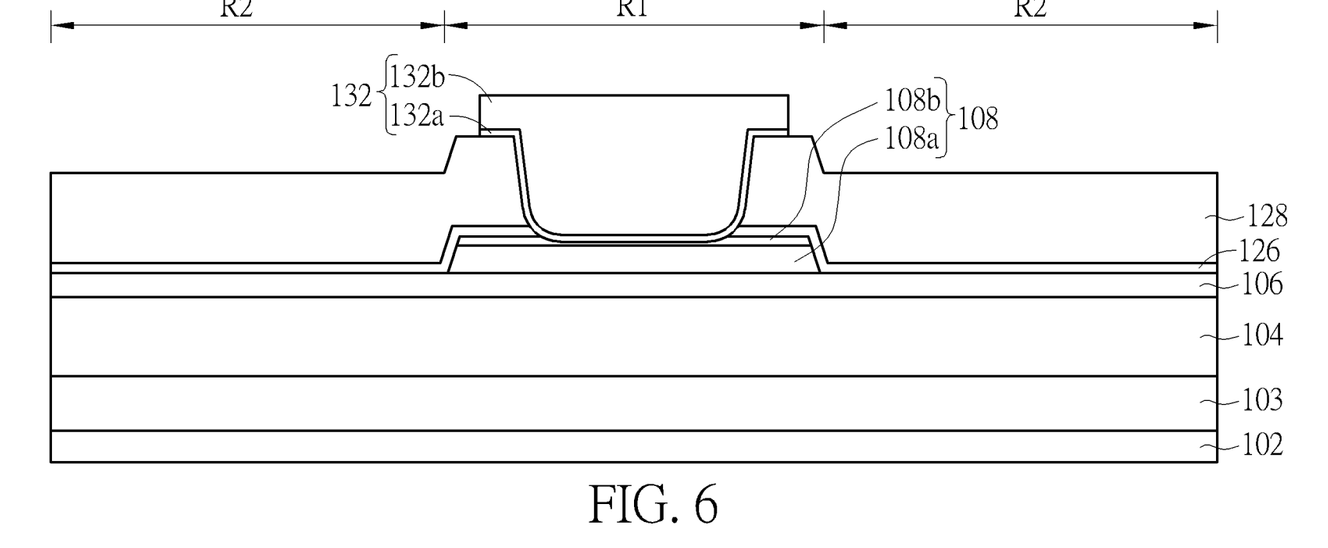
Figure 6A:
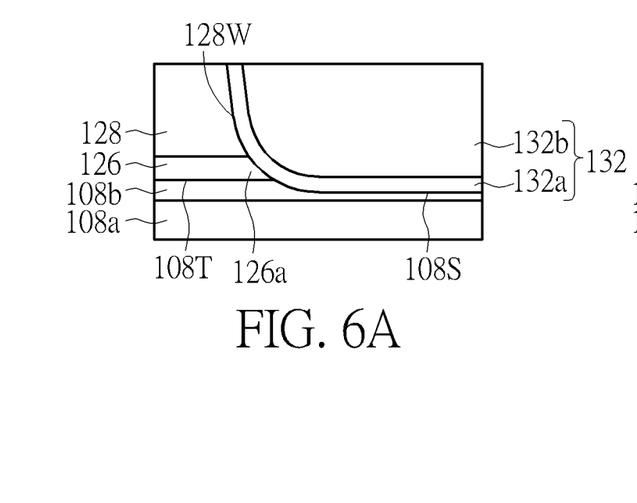
FIG. 6A is an enlarged view of a portion of the semiconductor structure shown in FIG. 6.
Figure 6B:
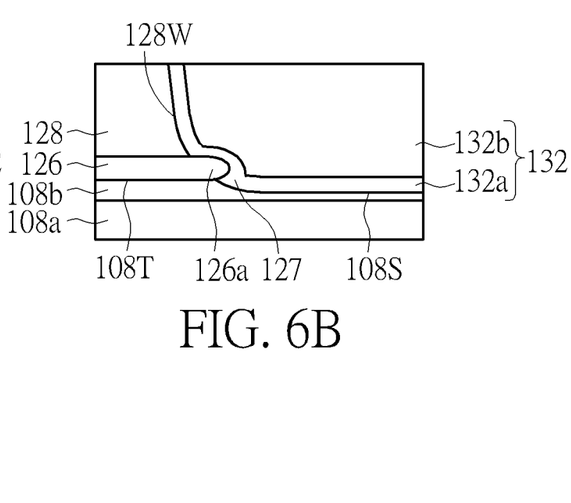
FIG. 6B is an enlarged view of a portion of a variant of the semiconductor structure shown in FIG. 6.

FIG. 4, FIG. 5 and FIG. 6 are schematic cross-sectional views illustrating the steps for forming a semiconductor structure according to a second embodiment of the present invention. FIG. 6A is an enlarged view of a portion of the semiconductor structure shown in FIG. 6. FIG. 6B is an enlarged view of a portion of a variant of the semiconductor structure shown in FIG. 6. In the second embodiment, the gate layer of the semiconductor structure may include a semiconductor gate layer and a metal gate layer disposed on the semiconductor gate layer.

Please refer to FIG. 4. The semiconductor structure according to the second embodiment may include a substrate 102, a stacked structure 101 disposed on the substrate 102, an insulating layer 126 on the stacked structure 101, and a passivation layer 128 on the insulating layer 126. The stacked structure 101 has a multi-layered structure, and may include a buffer layer 103, a channel layer 104, a barrier layer 106, and a gate layer 108, wherein the gate layer 108 includes a semiconductor gate layer 108a and a metal gate layer 108b disposed on the semiconductor gate layer 108a. The semiconductor gate layer 108a may include a III-V semiconductor material. According to an embodiment of the present invention, the semiconductor gate layer 108a includes p-type gallium nitride (p-GaN) having dopants such as magnesium (Mg), iron (Fe) or other suitable p-type dopants. The metal gate layer 108b may include a metal, such as aluminum (Al), silver (Ag), gold (Au), copper (Cu), nickel (Ni), titanium (Ti), tantalum (Ta), tungsten (W), cobalt (Co), molybdenum (Mo), palladium (Pd), platinum (Pt), a compound of the above materials, a composite layer of the above materials, or an alloy of the above materials, but is not limited thereto. According to an embodiment of the present invention, the metal gate layer 108b includes titanium nitride (TiN). The thicknesses of the semiconductor gate layer 108a and the metal gate layer 108b may be adjusted according to design needs. Preferably, the thickness of the semiconductor gate layer 108a may be 1.5 to 10 times of the thickness of the metal gate layer 108b. According to an embodiment of the present invention, the thickness of the semiconductor gate layer 108a may be between 60 nm and 100 nm, and the thickness of the metal gate layer 108b may be between 10 nm and 40 nm, but are not limited thereto. The gate layer 108 shown in FIG. 4 may be obtained the following steps. After forming the semiconductor gate layer 108a on the barrier layer 106, the metal gate layer 108b is formed on the semiconductor gate layer 108a through a chemical vapor deposition process (CVD), a physical vapor deposition process (PVD), or an atomic layer deposition process (ALD). Afterward, a patterning process such as a photolithography-etching process may be performed to etch and remove the portions of the semiconductor gate layer 108a and the metal gate layer 108b outside the gate region R1, thereby obtaining the gate layer 108 as shown in FIG. 4. It should be noted that, in the second embodiment, the top surface 108T of the gate layer 108 is the top surface of the metal gate layer 108b.

Please refer to FIG. 5. Subsequently, a patterned mask (not shown) may be formed on the passivation layer 128, and an etching process E1 may be performed, using the patterned mask as an etching mask to etch the passivation layer 128 and the insulating layer 126 to form an opening 130 through the passivation layer 128 and the insulating layer 126 and exposing a surface 108S of the metal gate layer 108b. By particularly using etching gases including fluorine (F) and not includes chlorine (Cl) during the etching process E1, the portion of the metal gate layer 108b exposed from the opening 130 may be slightly recessed so that the surface 108S of the metal gate layer 108b exposed from the opening 130 may be lower than the top surface 108T of the metal gate layer 108b, and the recessed depth of the surface 108S may be well controlled within a range not larger than 5 nm, for example, between 1 nm and 2 nm. In the second embodiment, the insulating layer 126 may include an extending portion 126a adjacent to the bottom edge of the opening 130, protruding from a sidewall 128W of the passivation layer 128 and extending along the top surface 108T of the metal gate layer 108b.

Please refer to FIG. 6. Subsequently, a conductive layer (not shown) may be formed on the passivation layer 128, fills into the opening 130 and directly contacts the metal gate layer 108b on the surfaces 108S of the metal gate layer 108b. A patterning process is then performed to pattern and remove unnecessary portions of the conductive layer to form the contact structure 132.

Please refer to FIG. 6A. The surface 108S of the metal gate layer 108b is lower than the top surface 108T of the metal gate layer 108b covered by the insulating layer 126 and is in direct contact with the contact structure 132. The extending portion 126a of the insulating layer 126 is adjacent to the bottom edge of the contact structure 132 and protrudes from the sidewall 128W of the passivation layer 128, and extends along the top surface 108T of the metal gate layer 108b to be adjacent to the surface 108S of the metal gate layer 108 and adjoin the edge of the surface 108S of the metal gate layer 108b (the boundary between the top surface 108T and the surface 108S of the metal gate layer 108b). According to an embodiment of the present invention, the surface of the extending portion 126a directly contacting the contact structure 132 and the surface 108S of the metal gate layer 108b may collectively form a continuous curved profile. The metal gate layer 108b may improve the bonding between the semiconductor gate layer 108a and the contact structure 132. Furthermore, the metal gate layer 108b may also protect the semiconductor gate layer 108a from being damaged during the etching process E1. More important, in comparison with the semiconductor structure shown in FIG. 3 having the Schottky contact formed between the etched surface 108S of the gate layer 108 and the contact structure 132, the semiconductor structure shown in FIG. 6 has the Schottky contact formed between the semiconductor gate layer 108a and the metal gate layer 108b, which may have a better interfacial quality and more stable electrical characteristics.

Please refer to FIG. 6B. In some embodiments, by adjusting the etching selectivity to the insulating layer 126 during the etching process E1, the extending portion 126a may protrude further from the sidewall 128W of the passivation layer 128 and extends beyond the boundary between the top surface 108T and the surface 108S of the metal gate layer 108b and defines a space 127 between the extending portion 126a and the surface 108S of the metal gate layer 108b. The liner 132a may completely fill the space 127 or partially fill the space 127 to form an air gap (not shown) adjacent to the bottom edge of the contact structure 132. The extending portion 126a may provide adjustment to the electric field in nearby regions to increase threshold voltage and reduce gate leakage current.

FIG. 7, FIG. 8, FIG. 9, FIG. 10, and FIG. 11 are schematic cross-sectional views illustrating the steps for forming a semiconductor structure according to a third embodiment of the present invention. FIG. 8A is an enlarged view of a portion of the semiconductor structure shown in FIG. 8. FIG. 8B is an enlarged view of a portion of a variant of the semiconductor structure shown in FIG. 8. In the third embodiment, the semiconductor structure may further include source/drain contacts formed on the source/drain regions of the stacked structure.

Figure 7:
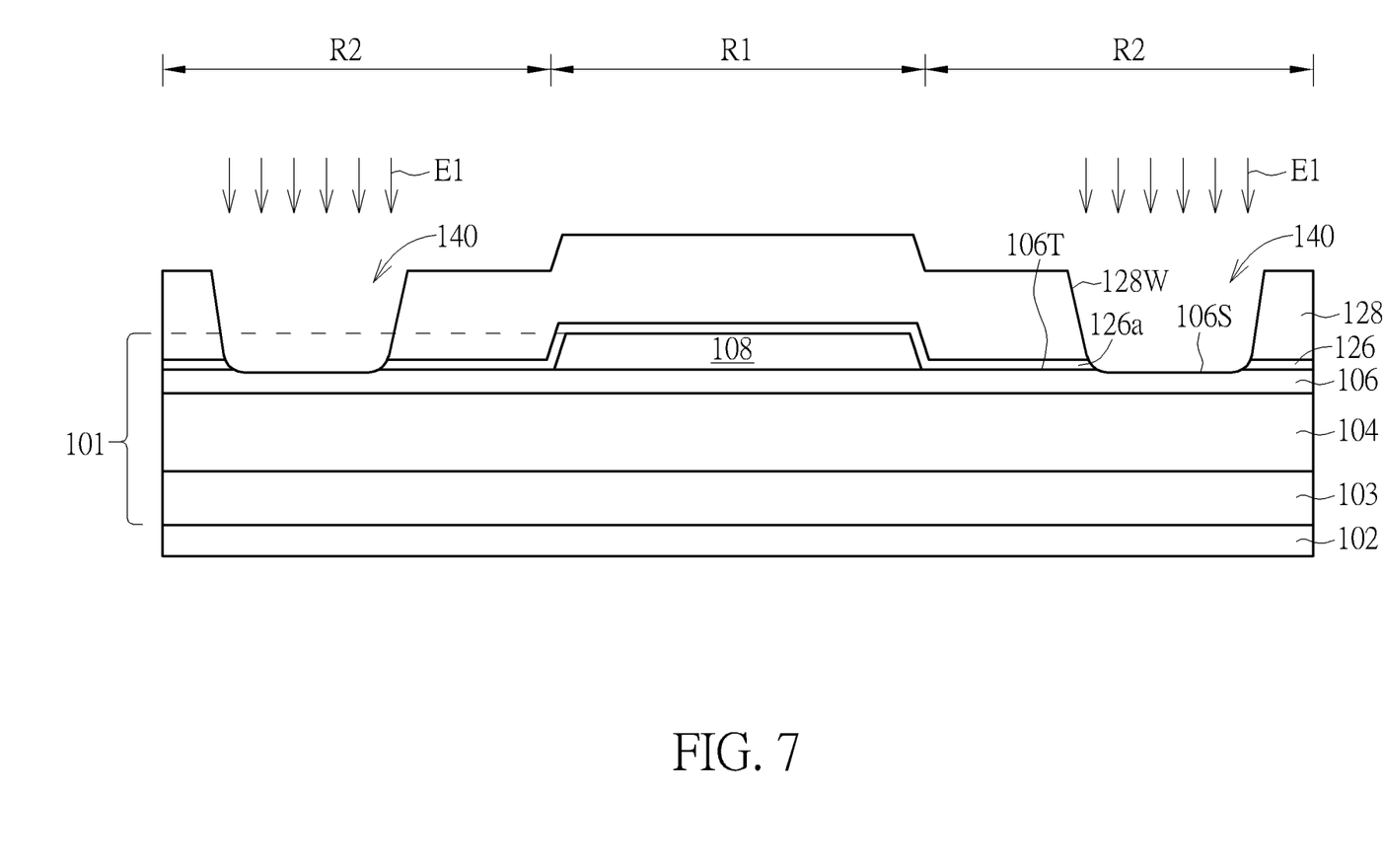
FIG. 7, FIG. 8, FIG. 9, FIG. 10, and FIG. 11 are schematic cross-sectional views illustrating the steps for forming a semiconductor structure according to a third embodiment of the present invention.

Please refer to FIG. 7. The semiconductor structure according to the second embodiment may include a substrate 102, and a stacked structure 101 formed on the substrate 102. The stacked structure 101 has a multi-layered structure, and may include a buffer layer 103, a channel layer 104, a barrier layer 106, and a gate layer 108 on a gate region R1 of the stacked structure 101. After forming an insulating layer 126 and a passivation layer 128 on the stacked structure 101, an etching process E1 is performed to form openings 140 through the passivation layer 128 and the insulating layer 126 to expose surfaces 106S of portions of the barrier layer 106 of the source/drain regions R2 of the stacked structure 101 at two sides of the gate region R1. By particularly using etching gases including fluorine (F) and not includes chlorine (Cl) during the etching process E1, the portions of the barrier layer 108b exposed from the openings 140 may respectively be slightly recessed so that the surfaces 106S of the barrier layer 108b exposed from the openings 140 may be lower than the top surface 106T of the barrier layer 106, and the recessed depths of the surfaces 106S may be well controlled within a range not larger than 5 nm, for example, between 1 nm and 2 nm. After the etching process E1, the insulating layer 126 adjacent to the bottom edge of the openings 140 may respectively include an extending portion 126a exposed from the opening 140, protruding from a sidewall 128W of the passivation layer 128 and extending along the top surface 106T of the barrier layer 106.

Figure 8:
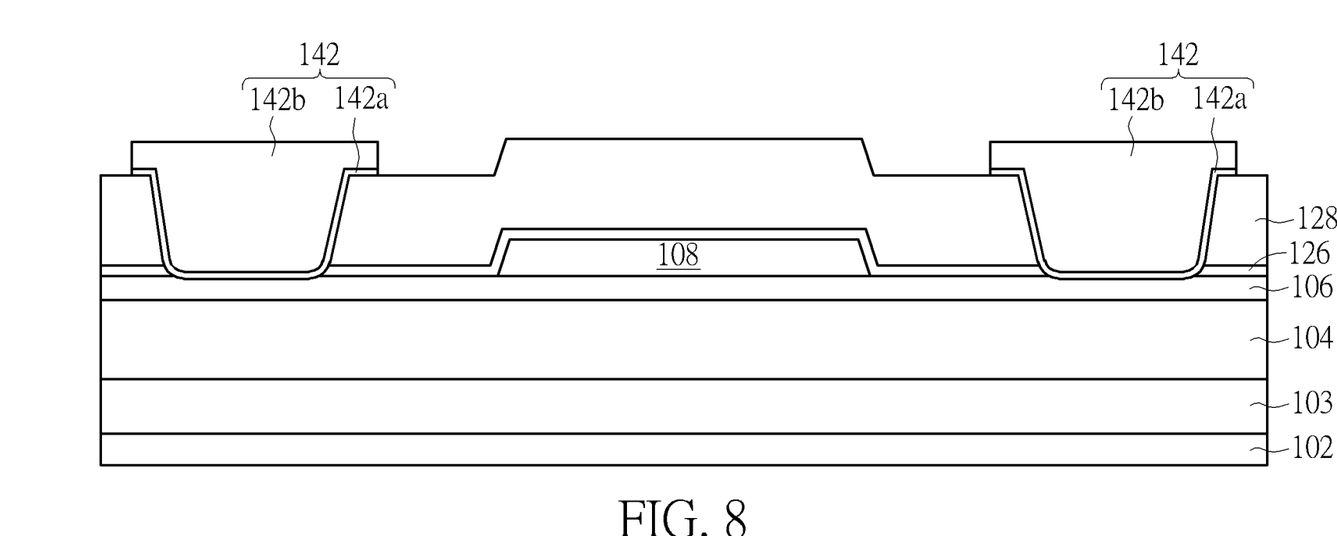
Figure 8A:
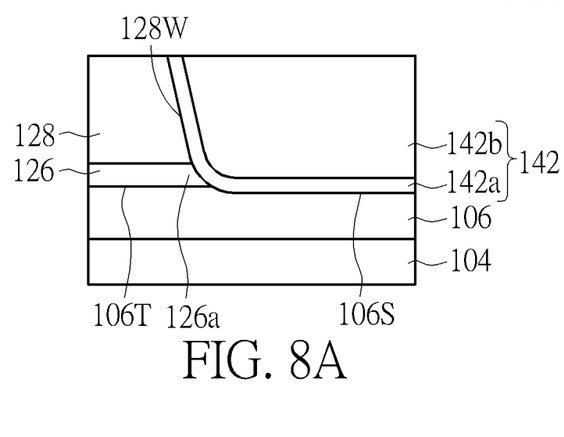
FIG. 8A is an enlarged view of a portion of the semiconductor structure shown in FIG. 8.
Figure 8B:
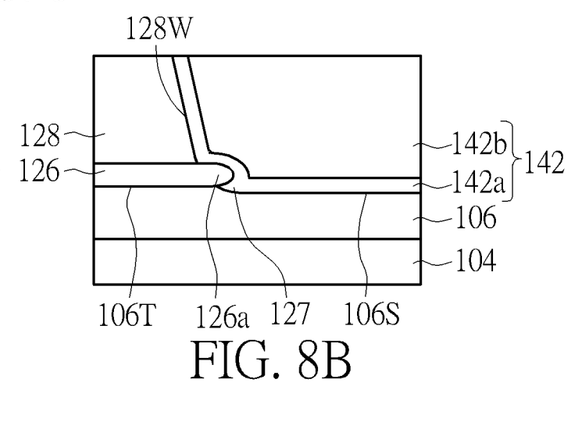
FIG. 8B is an enlarged view of a portion of a variant of the semiconductor structure shown in FIG. 8.

Please refer to FIG. 8. Subsequently, a conductive layer (not shown) may be formed on the passivation layer 128, fills into the openings 140 and directly contacts the barrier layer 106 on the surfaces 106S of the barrier layer 106. A patterning process is then performed to pattern and remove unnecessary portions of the conductive layer to form the contact structures 142. The contact structures 142 may be the source/drain contacts of the semiconductor structure. According to an embodiment of the present invention, the contact structures 142 may respectively include a liner 142a and a metal layer 142b on the liner 142a. The materials of the liner 142a and the metal layer 142b may be referred to the materials for the liner 132a and the metal layer 132b, and will not be illustrated herein for the sake of simplifying the description. The liner 142a is in direct contact with the barrier layer 106, the insulating layer 126, and the passivation layer 128. The liner 142a may improve the bonding between the metal layer 142b and the barrier layer 106, the insulating layer 126, and the passivation layer 128. The liner 142a may also suppress extrusion or diffusion of the metal layer 142b that may result in reliability degradation of the device. According to the embodiment, an ohmic contact may be formed between the contact structure 142 and the barrier layer 106.

Please refer to FIG. 8A. The surface 106S of the barrier layer 106 is in direct contact with the contact structure 142 and is lower than the top surface 106T of the barrier layer 106 covered by the insulating layer 126. The extending portion 126a of the insulating layer 126 is adjacent to the bottom edge of the contact structure 142 and protrudes from the sidewall 128W of the passivation layer 128, and extends along the top surface 106T of the barrier layer 106 to be adjacent to the surface 106S of the barrier layer 106 and adjoin the edge of the surface 106S of the barrier layer 106 (the boundary between the top surface 106T and the surface 106S of the barrier layer 106). According to an embodiment of the present invention, the surface of the extending portion 126a directly contacting the contact structure 142 and the surface 106S of the barrier layer 108b may collectively form a continuous curved profile.

Please refer to FIG. 8B. In some embodiments, by adjusting the etching selectivity to the insulating layer 126 during the etching process E1, the extending portion 126a may protrude further from the sidewall 128W of the passivation layer 128 and extends beyond the boundary between the top surface 106T and the surface 106S of the barrier layer 106 and defines a space 127 between the extending portion 126a and the surface 106S of the barrier layer 106. The liner 142a may completely fill the space 127 or partially fill the space 127 to form an air gap (not shown) adjacent to the bottom edge of the contact structure 142. The extending portion 126a may provide adjustment to the electric field in nearby regions to increase threshold voltage and reduce source/drain leakage current.

Figure 9:
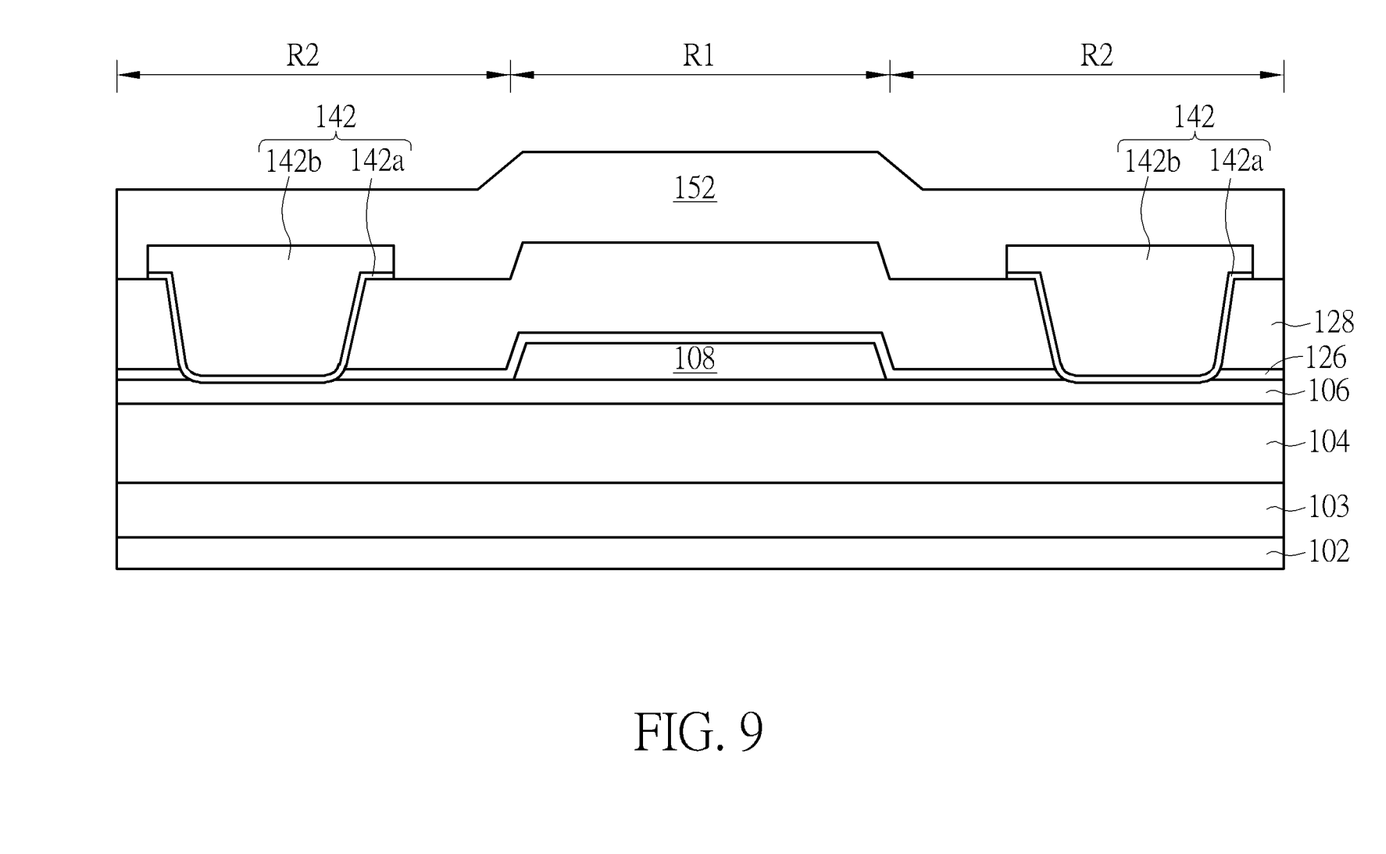

Please refer to FIG. 9. Subsequently, another passivation layer 152 is formed on the passivation layer 128 and covers the contact structures 142. The material of the passivation layer 152 may be referred to the materials for the passivation layer 128, and will not be illustrated herein for the sake of simplifying the description. The materials of the passivation layer 128 and the passivation layer 152 may be the same or may be different.

Figure 10:
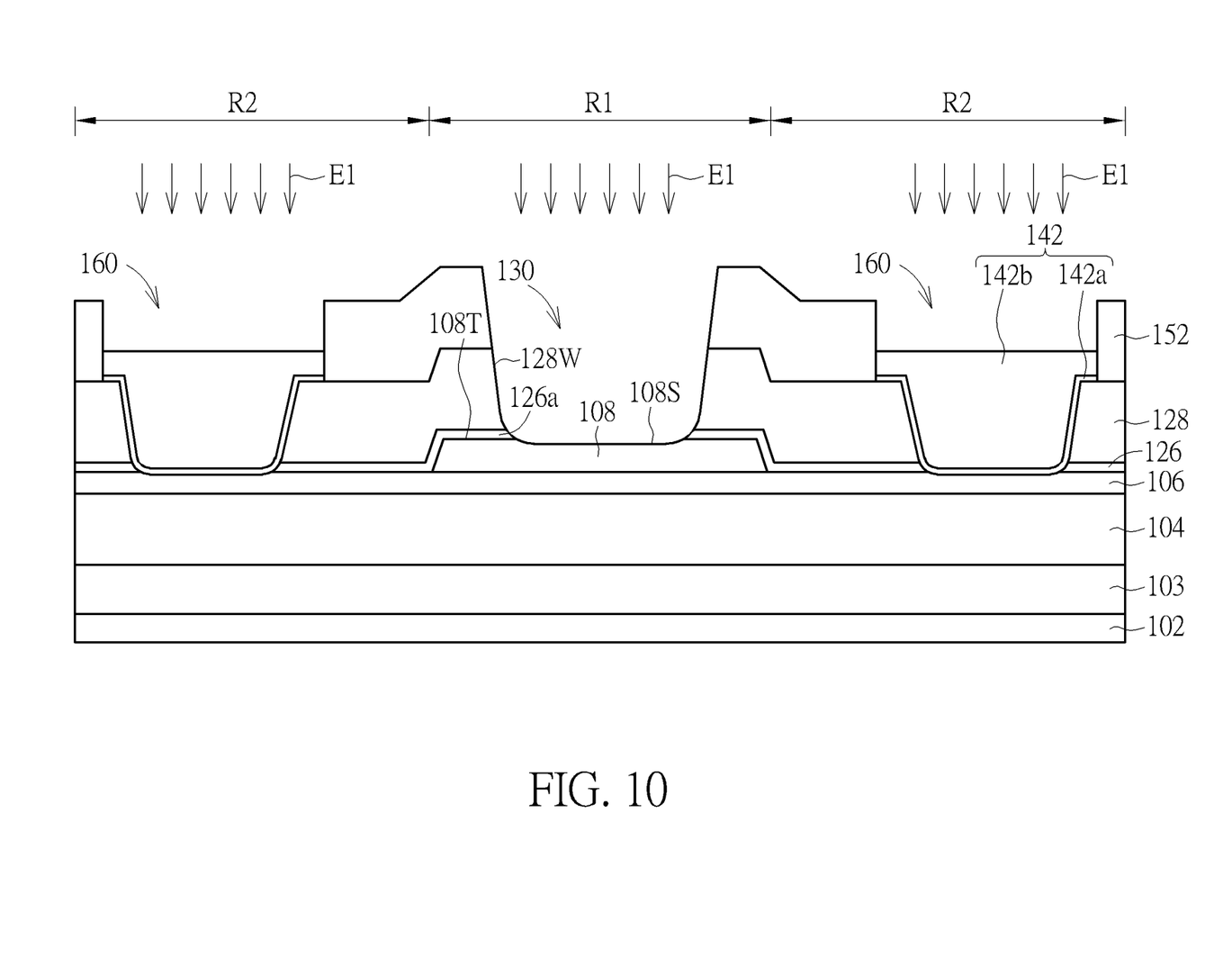

Please refer to FIG. 10. Another etching process E1 may be performed to concurrently form an opening 130 through the passivation layer 152, the passivation layer 128, and the insulating layer 126 on the gate region R1 of the stacked structure 101 and openings 160 through the passivation layer 152 on the source/drain regions R2 of the stacked structure 101. The etching process E1 shown in FIG. 10 and the etching process E1 shown in FIG. 7 may use the same etching gases, such as etching gases including fluorine (F) and not includes chlorine (Cl), and may have similar process parameters. The opening 130 exposes a portion of the gate layer 108. The openings 160 respectively expose portions of the contact structures 142. The portion of the gate layer 108 exposed from the opening 130 may be slight recessed during the etching process E1 so that the surface 108S of the gate layer 108 may be lower than the top surface 108T of the gate layer 108. The insulating layer 126 may include an extending portion 126a adjacent to the bottom edge of the opening 130, protrudes from the sidewall 128W of the passivation layer 128, and extends along the top surface 108T of the gate layer 108.

Figure 11:
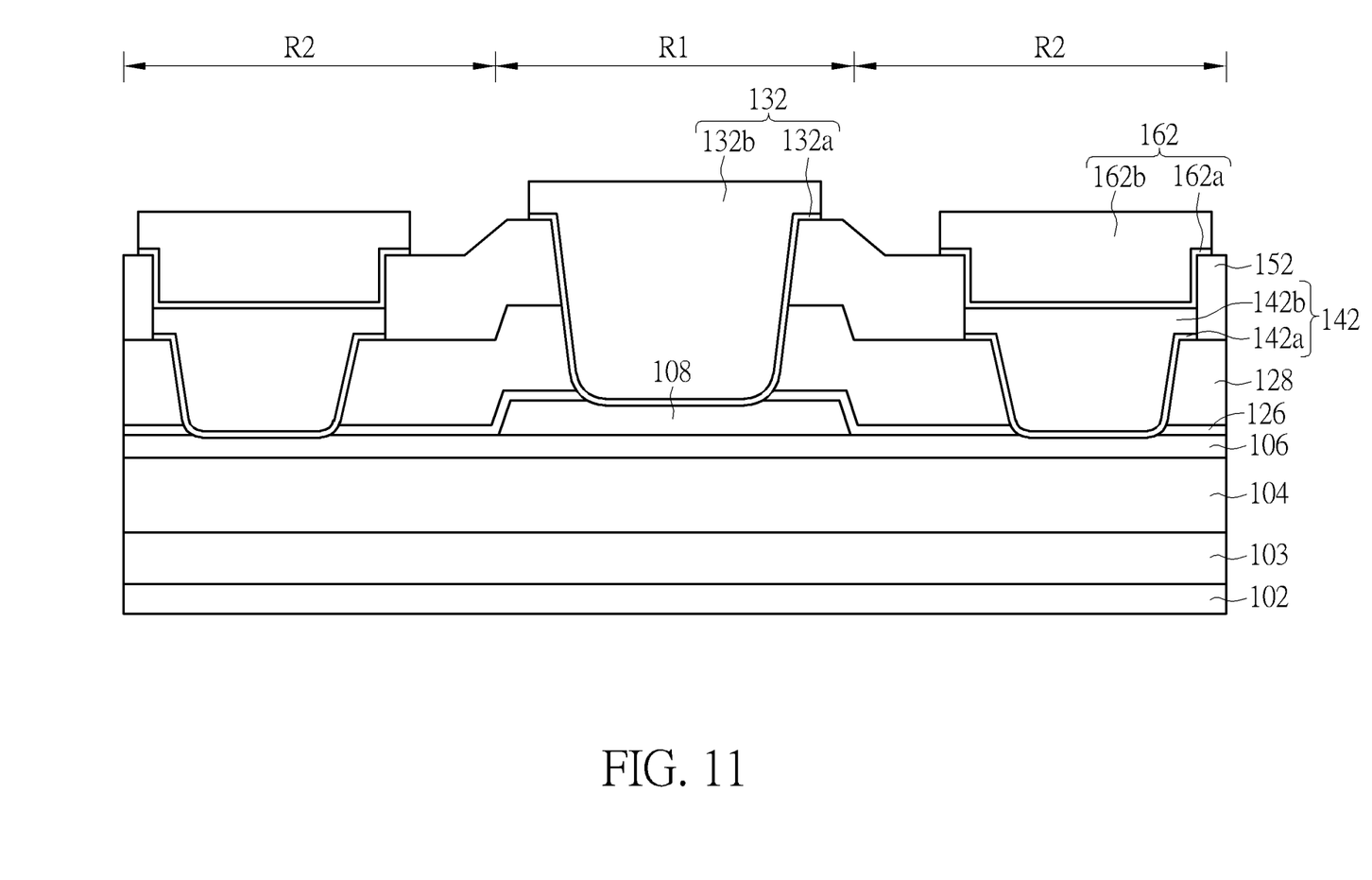

Please refer to FIG. 11. Subsequently, a conductive layer (not shown) may be formed on the passivation layer 152, fills into the opening 130 and the openings 160 and directly contacts the gate layer 108 on the surface 108S and the exposed portions of the contact structures 142. A patterning process may be performed to pattern and remove unnecessary portions of the conductive layer to form the contact structure 132 on the gate layer 108 and the electrodes 162 on the contact structures 142. The electrodes 162 may respectively include a liner 162a and a metal layer 162b on the liner 162a. The materials of the liner 162a and the metal layer 162b may be referred to the materials for the liner 132a and the metal layer 132b, and will not be illustrated herein for the sake of simplifying the description. According to the embodiment, the liner 132a and the liner 162a may include a same material, such as titanium nitride (TiN), and the metal layer 132b and the metal layer 162b may include a same material, such as aluminum (Al).

In conclusion, the present invention provides a semiconductor structure and a method for forming the same, which may ensure a better etching result of contact openings by using etching gases comprising fluorine (F) and not comprising chlorine (Cl) during the etching process. The problems of defective contact caused by residues of the insulating layer (under-etching) or damages of the semiconductor layer (over-etching) may be resolved. Meanwhile, by forming the extending portion of the insulating layer adjacent to the bottom edge of the contact structure, the leakage current may be reduced, and the performance of the device for high frequency applications may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a semiconductor structure, comprising:
　　forming a stacked structure on a substrate;
　　forming an insulating layer on the stacked structure;
　　forming a passivation layer on the insulating layer;
　　performing an etching process to form an opening through the passivation layer and the insulating layer to expose a top surface of the stacked structure and an extending portion of the insulating layer that protrudes from a sidewall of the opening and hangs above the top surface of the stacked structure;

forming a liner along and in direct contact with the sidewall of the opening, a top surface and a bottom surface of the extending portion, and the top surface of the stacked structure; and forming a metal layer on the liner and filling the opening.

2. The method for forming a semiconductor structure according to claim 1, wherein the etching process comprises using etching gases comprising fluorine (F) and not comprising chlorine (Cl).

3. The method for forming a semiconductor structure according to claim 1, wherein the etching process comprises using an etching gas comprising at least one of $SF_6$, $CF_4$, $CHF_3$, $C_3F_6$, $C_2F_6$, and $NF_3$.

4. The method for forming a semiconductor structure according to claim 1, wherein the insulating layer comprises aluminum oxide ($Al_2O_3$), and the passivation layer comprises silicon oxide ($SiO_x$) or silicon nitride (SiN).

5. The method for forming a semiconductor structure according to claim 1, wherein the step of forming the stacked structure comprises:

forming a buffer layer on the substrate;

forming a channel layer on the buffer layer; and forming a barrier layer on the channel layer, wherein the barrier layer directly contacts the extending portion of the insulating layer and the contact structure.

6. The method for forming a semiconductor structure according to claim 5, wherein the buffer layer, the channel layer, and the barrier layer respectively comprise III-V semiconductor materials.

7. The method for forming a semiconductor structure according to claim 1, wherein the step of forming the stacked structure comprises:

forming a buffer layer on the substrate;

forming a channel layer on the buffer layer;

forming a barrier layer on the channel layer; and forming a gate layer on the barrier layer, wherein the gate layer directly contacts the extending portion of the insulating layer and the contact structure.

8. The method for forming a semiconductor structure according to claim 7, wherein the gate layer comprises a semiconductor gate layer and the semiconductor gate layer comprises a P-doped III-V semiconductor material.

9. The method for forming a semiconductor structure according to claim 7, wherein the gate layer comprises:

a semiconductor gate layer on the barrier layer; and a metal gate layer on the semiconductor gate layer, wherein the metal gate layer directly contacts the extending portion of the insulating layer and the contact structure.

10. The method for forming a semiconductor structure according to claim 9, wherein the semiconductor gate layer comprises a P-doped III-V semiconductor material, the metal gate layer comprises titanium nitride (TiN).

* * * * *